(12) United States Patent
Shim et al.

(10) Patent No.: US 12,032,232 B2
(45) Date of Patent: Jul. 9, 2024

(54) OPTICAL ELEMENT ARRAY, OPTICAL SYSTEM AND METHOD OF MANUFACTURING OPTICAL ELEMENT ARRAY

(71) Applicant: SAMSUNG ELECTRONICS CO., LTD., Suwon-si (KR)

(72) Inventors: Dongsik Shim, Hwaseong-si (KR); Changgyun Shin, Anyang-si (KR); Changbum Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/307,080

(22) Filed: Apr. 26, 2023

(65) Prior Publication Data

US 2023/0258966 A1 Aug. 17, 2023

Related U.S. Application Data

(62) Division of application No. 16/426,861, filed on May 30, 2019, now Pat. No. 11,675,220.

(30) Foreign Application Priority Data

Dec. 10, 2018 (KR) .................. 10-2018-0158461

(51) Int. Cl.
*H01S 5/02* (2006.01)
*G01S 7/481* (2006.01)
(Continued)

(52) U.S. Cl.
CPC ............ *G02F 1/025* (2013.01); *G01S 7/4814* (2013.01); *H01S 5/0071* (2013.01);
(Continued)

(58) Field of Classification Search
CPC ...... G02F 1/025; G02F 1/292; G02F 2203/24; G02F 2203/50; G02F 1/2955;
(Continued)

(56) References Cited

U.S. PATENT DOCUMENTS 7,974,326 B2 7/2011 Leem et al.
9,136,321 B1 9/2015 Narasimha et al.
(Continued)

FOREIGN PATENT DOCUMENTS

| JP | 6-52743 B2 | 7/1994 | |
|---|---|---|---|
| KR | 2009-0061873 A | 6/2009 | |
| WO | WO-2020108169 A1 * | 6/2020 | ............. G01S 7/481 |

OTHER PUBLICATIONS

Roelkens et al., "Wafer Bonding and Heterogeneous Integration: III-V/Silicon Photonics", Eindhoven, The Netherlands, Jun. 2008, pp. 87-90, 4 pages total.
(Continued)

*Primary Examiner* — Xinning (Tom) Niu
(74) *Attorney, Agent, or Firm* — Sughrue Mion, PLLC

(57) ABSTRACT

Provided in a method of fabricating an optical element array including providing a silicon substrate, providing a first element layer on the silicon substrate, the first element layer including a plurality of passive optical elements, providing a plurality of semiconductor blocks on a compound semiconductor wafer, providing semiconductor dies by dicing the compound semiconductor wafer by the plurality of semiconductor blocks, and providing a second element layer by providing the semiconductor dies on the first element layer, each of the plurality of semiconductor blocks contacting at least one corresponding passive optical element from among the plurality of passive optical elements.

10 Claims, 26 Drawing Sheets

(51) Int. Cl.
*G02F 1/025* (2006.01)
*H01S 5/00* (2006.01)
*H01S 5/028* (2006.01)
*H01S 5/30* (2006.01)
*H01S 5/40* (2006.01)
*G02F 1/29* (2006.01)

(52) U.S. Cl.
CPC ............ *H01S 5/0201* (2013.01); *H01S 5/021* (2013.01); *H01S 5/0218* (2013.01); *H01S 5/0282* (2013.01); *H01S 5/3013* (2013.01); *H01S 5/4025* (2013.01); *H01S 5/4075* (2013.01); *G02F 1/292* (2013.01); *G02F 2203/24* (2013.01); *G02F 2203/50* (2013.01); *H01S 5/005* (2013.01); *H01S 2301/176* (2013.01)

(58) Field of Classification Search
CPC .... G01S 7/4814; G01S 7/4815; H01S 5/0071; H01S 5/0201; H01S 5/021; H01S 5/0218; H01S 5/0282; H01S 5/3013; H01S 5/4025; H01S 5/4075; H01S 5/005; H01S 2301/176; H01S 5/02326; H01S 5/0085; H01S 5/02345; H01S 5/04257; H01S 5/1032; H01L 27/14; H01L 21/02554; H01L 21/28264; H01L 21/304; H01L 21/31051; H01L 21/31105; H01L 21/768; H01L 21/78; H01L 31/12; H10N 70/231
See application file for complete search history.

(56) References Cited

U.S. PATENT DOCUMENTS

| | | | | |
|---|---|---|---|---|
| 2002/0076841 | A1* | 6/2002 | Chang | H01S 5/0014 438/15 |
| 2002/0122180 | A1* | 9/2002 | Szafraniec | G01J 9/04 356/484 |
| 2007/0064060 | A1* | 3/2007 | Gu | B41J 2/1631 347/65 |
| 2009/0154517 | A1* | 6/2009 | Leem | H01S 5/1032 372/50.11 |
| 2012/0300796 | A1* | 11/2012 | Sysak | B82Y 20/00 372/6 |
| 2017/0317473 | A1* | 11/2017 | Liang | H01S 5/347 |

OTHER PUBLICATIONS

Kurita et al., "III-V/Si Chip-on-Wafer Direct Transfer Bonding Technology (CoW DTB); Process Capabilities and Bonded Structure Characterizations", Sep. 2016, 2016 6th Electronic System—Integration Technology Conference (ESTC), IEEE, 6 pages total.
Roelkens et al, "Hybrid Silicon Lasers", Proceedings of SPIE—The International Society for Optical Engineering, Feb. 2011, 10 pages total.
Communication dated Mar. 21, 2024 issued in corresponding Republic of Korea Patent Application No. 10-2018-0158461.

* cited by examiner

OPTICAL ELEMENT ARRAY, OPTICAL SYSTEM AND METHOD OF MANUFACTURING OPTICAL ELEMENT ARRAY

CROSS-REFERENCE TO RELATED APPLICATION

This application is a divisional application of U.S. patent application Ser. No. 16/426,861 filed on May 30, 2019, which claims priority from Korean Patent Application No. 10-2018-0158461, filed on Dec. 10, 2018, in the Korean Intellectual Property Office, the disclosure of which is incorporated herein in its entirety by reference.

BACKGROUND

1. Field

Example embodiments of the present disclosure relate to an optical element array, an optical system, and a method of manufacturing the optical element array.

2. Description of the Related Art

Various methods are used to steer a laser beam to a desired position. A laser beam may be steered by mechanically rotating a laser beam irradiating portion or using interference of a laser bundle in the form of several pixels or a waveguide by using an optical phased array (OPA) method. At this time, a laser beam is steered by electrically or thermally controlling the pixels or the waveguide.

An optical element array used in the OPA method may generally be fabricated by forming a plurality of passive optical elements on a silicon substrate, attaching a compound semiconductor wafer including a Group III-V semiconductor material to the some of plurality of passive optical elements, and forming an active optical element by patterning the compound semiconductor wafer. The compound semiconductor wafer may be fabricated to have a relatively small size as compared to the silicon substrate due to technical difficulties.

Therefore, when a compound semiconductor wafer is bonded to a silicon substrate, the efficiency of using the compound semiconductor wafer is low.

SUMMARY

One or more example embodiments provide a method of fabricating an optical element array that reduces the waste of a compound semiconductor wafer.

One or more example embodiments also provide an optical element array that reduces the waste of a compound semiconductor wafer.

One or more example embodiments also provide an optical system that includes an optical element array that reduces the waste of a compound semiconductor wafer.

Additional aspects will be set forth in part in the description which follows and, in part, will be apparent from the description, or may be learned by practice of example embodiments.

According to an aspect of an example embodiment, there is provided a method of fabricating an optical element array, the method including providing a silicon substrate, providing a first element layer on the silicon substrate, the first element layer including a plurality of passive optical elements, providing a plurality of semiconductor blocks on a compound semiconductor wafer, providing semiconductor dies by dicing the compound semiconductor wafer by the plurality of semiconductor blocks, and providing a second element layer by providing the semiconductor dies on the first element layer, each of the plurality of semiconductor blocks contacting at least one corresponding passive optical element from among the plurality of passive optical elements.

The providing of the second element layer may include removing the compound semiconductor wafer, and providing a first passivation layer covering the first element layer and the semiconductor block.

The providing of the second element layer may include providing a planarization material on the first passivation layer, and chemically-mechanically polishing the planarization material.

The providing of the second element layer may include patterning the semiconductor block after chemically-mechanically polishing the planarization material, and providing electrodes on the patterned semiconductor block and some of the passive optical elements from among the plurality of passive optical elements.

The providing of the second element layer may include providing a proton implant layer on the semiconductor block, and providing a second passivation layer covering the electrodes and the semiconductor block.

The plurality of passive optical elements may include a plurality of waveguides provided by patterning the substrate, an antenna, and a phase modulator provided by doping some of the plurality of waveguides with an impurity, wherein a dielectric layer may be provided on the plurality of passive optical elements, and wherein the dielectric layer may be planarized through a chemical-mechanical polishing.

The method may further include providing an oxide layer on the silicon substrate, and providing a silicon layer on the oxide layer.

The plurality of passive optical elements may be provided by patterning the silicon layer.

The providing of the oxide layer may include forming a plurality of trenches apart from one another in the silicon substrate, and filling oxide in the plurality of trenches.

According to another aspect of an example embodiment, there is provided an optical element array including a silicon substrate, a first element layer provided on the silicon substrate, the first element layer including a waveguide configured to transmit light, a phase modulator configured to adjust a phase of the light, and an antenna configured to adjust a traveling direction of light with the phase modulated by the phase modulator, and a second element layer provided on the waveguide, the second element layer including an active optical element that is configured to generate light and includes a semiconductor material that is configured to generate light.

The semiconductor material may include a Group III-V semiconductor material.

The active optical element may include a first passivation layer provided on a planarizing material on the semiconductor material, the planarizing material being planarized through chemical-mechanical polishing.

The first passivation layer may include any one of nitrogen and a metal.

The planarizing material may include at least one of an oxide and a polymer.

The active optical element may include proton implant layers spaced apart from one another.

The proton implant layers may be configured to constrain charges.

The first element layer may include a plurality of trenches provided in the substrate spaced apart from one another, and the phase modulator, the antenna, and the waveguide are provided in the trenches.

The trenches may be filled with oxide.

According to an aspect of another example embodiment, there is provided an optical system including an optical element array configured to generate light and direct the traveling direction of the light towards an object, the optical element array including a silicon substrate, a first element layer provided on the silicon substrate, the first element layer including a waveguide configured to transmit light, a phase modulator configured to adjust a phase of the light, and an antenna configured to adjust a traveling direction of light with the phase modulated by the phase modulator, and a second element layer provided on the waveguide, the second element layer including an active optical element that is configured to generate light and includes a semiconductor material, a receiver configured to receive light from the object, and a processor configured to control the receiver and the optical element array.

The processor may include an analyzer configured to analyze light received by the receiver.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
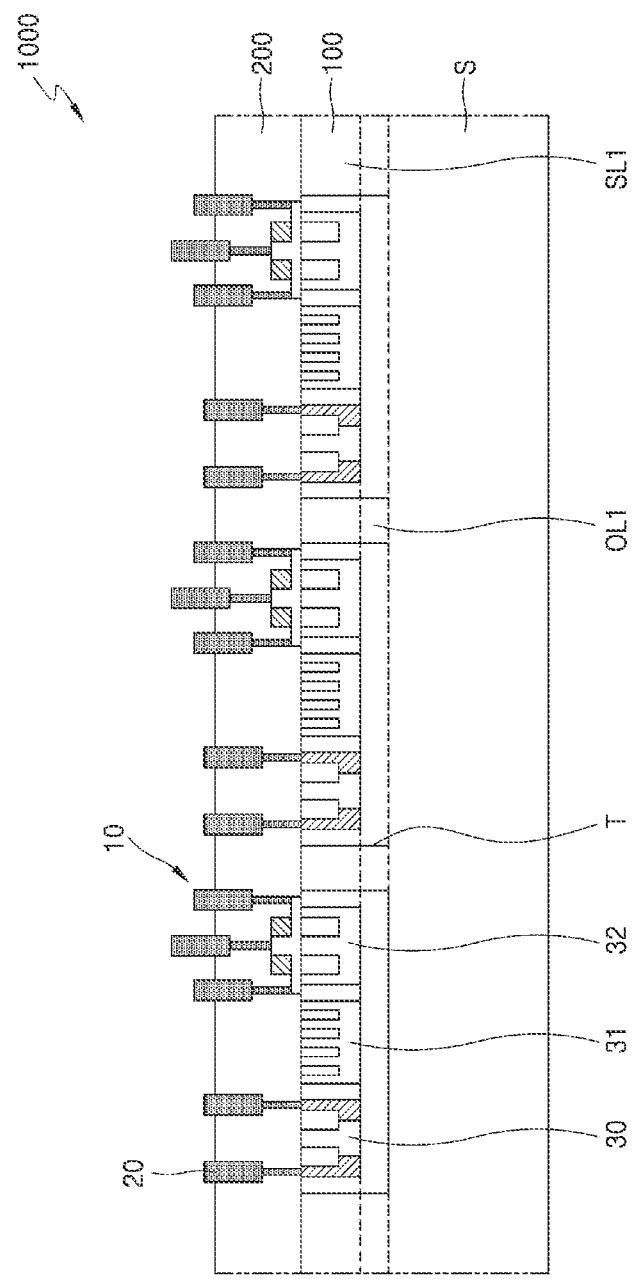
FIG. 1 is a schematic lateral cross-sectional view of an optical element array according to an example embodiment.

Reference will now be made in detail to example embodiments of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, an optical element array according to example embodiments and a method of fabricating the same will be described in detail with reference to the accompanying drawings. In the drawings, like reference numerals denote like elements, and the size and the thickness of each element may be exaggerated for clarity of explanation.

While such terms as "first," "second," etc., may be used to describe various elements, such elements must not be limited to the above terms. The above terms may be used only to distinguish one element from another. The disclosure may, however, be embodied in many different forms and should not be construed as limited to example embodiments set forth herein.

In addition, unless explicitly described to the contrary, the word "comprise" and variations such as "comprises" or "comprising" will be understood to imply the inclusion of stated elements but not the exclusion of any other elements.

FIG. 1 is a schematic lateral cross-sectional view of an optical element array 1000 according to an example embodiment.

Referring to FIG. 1, the optical element array 1000 may include a silicon substrate S, a first element layer 100 provided on the silicon substrate S, and a second element layer 200 provided on the first element layer 100 opposite to the silicon substrate S. The first element layer 100 may include a plurality of passive optical elements. The plurality of passive optical elements may include, for example, an optical waveguide 32 configured to transmit light, a phase modulator 30 configured to adjust the phase of light transmitted from the optical waveguide 32, and an antenna 31 configured to adjust the traveling direction of light with the phase modulated by the phase modulator 30. The second element layer 200 may include an active optical element 10 that is provided on at least one of the plurality of passive optical elements, e.g., the optical waveguide 32, includes a semiconductor material, and generates light.

The first element layer 100 may have a structure in which an oxide layer OL1 and a silicon layer SL1 are sequentially stacked. The oxide layer OL1 may include a plurality of trenches T filled with an oxide and spaced apart from one another.

The first element layer 100 may include a plurality of passive optical elements formed by patterning the silicon layer SL1. The plurality of passive optical elements may be surrounded by an oxide. For example, the plurality of passive optical elements may be provided within the trenches T. The plurality of passive optical elements may include the phase modulator 30, the antenna 31, and the optical waveguide 32. Connection relationships among the phase modulator 30, the antenna 31, and the optical waveguide 32 will be described below with reference to FIG. 6.

The second element layer 200 may include at least one active optical element 10. For example, the at least one active optical element 10 may be formed by attaching a semiconductor block onto the optical waveguide 32 and then patterning the same. Detailed description thereof will be given below. The semiconductor block may include a Group III-V semiconductor material. The at least one active optical element 10 may include, for example, a light source including a laser diode (LD) or a transformable laser diode (TLD). In addition, the second element layer 200 may include a plurality of electrodes 20 provided on the phase modulator 30. The electrode 20 may include at least one of nickel (Ni), germanium (Ge), and gold (Au).

Figure 2:
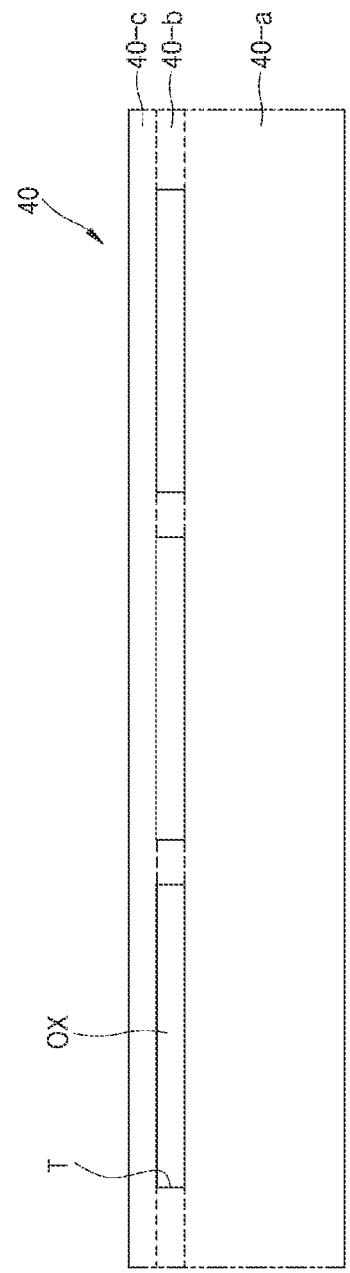
FIG. 2 is a schematic lateral cross-sectional view of a substrate used to form a first element layer included in the optical element array of FIG. 1.

FIG. 2 is a schematic lateral cross-sectional view of a substrate 40 used to form the first element layer 100 included in the optical element array 1000 of FIG. 1.

Referring to FIG. 2, the substrate 40 may include a silicon substrate 40-a, an oxide layer 40-b including a plurality of trenches T and an oxide OX filling the plurality of trenches T, and a silicon layer 40-c provided on the substrate 40-b. The first element layer 100 may be formed by patterning the silicon layer 40-c. A more detailed method of forming the first element layer 100 will be described below with reference to FIGS. 8 to 15.

Figure 3:
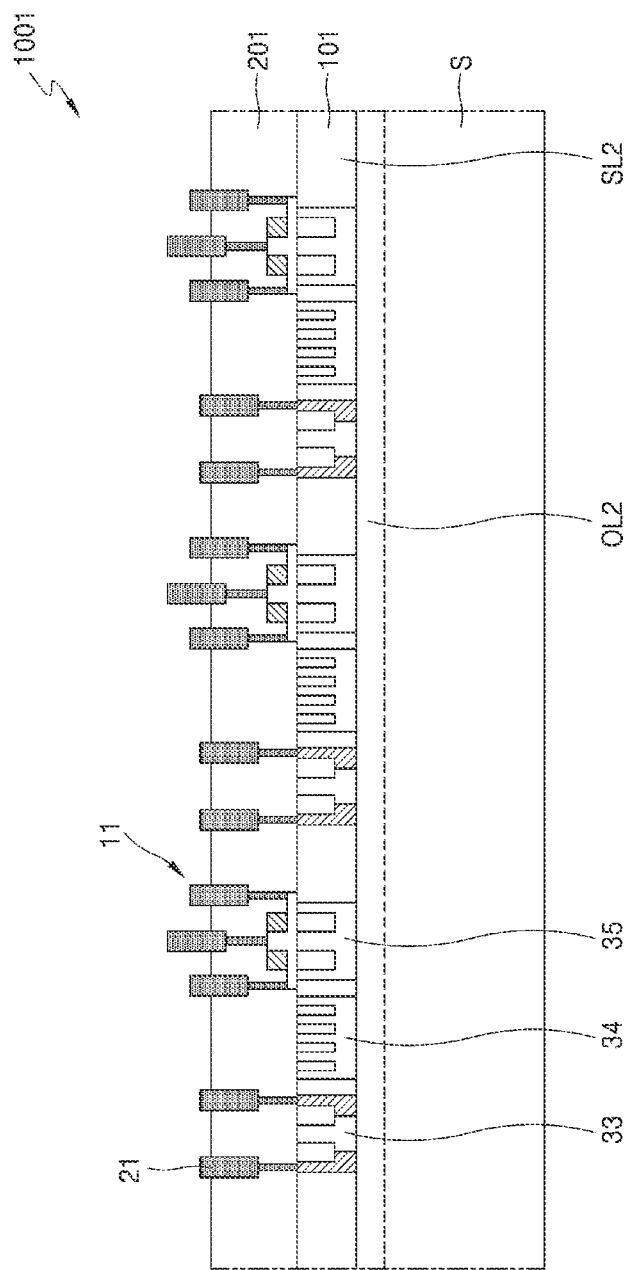
FIG. 3 is a schematic lateral cross-sectional view of an optical element array according to an example embodiment.

FIG. 3 is a schematic lateral cross-sectional view of an optical element array 1001 according to an example embodiment. A second element layer 201 shown in FIG. 3 may be the same as the second element layer 200 of FIG. 1.

Referring to FIG. 3, the optical element array 1001 may include the silicon substrate S, a first element layer 101 provided on the silicon substrate S, and the second element layer 201 provided on the first element layer 101 opposite to the silicon substrate S. The first element layer 101 may include a plurality of passive optical elements. The plurality of passive optical elements may include, for example, an optical waveguide 35 for transmitting light, a phase modulator 33 for adjusting the phase of light transmitted from the optical waveguide 35, and an antenna 34 configured to adjust the traveling direction of light with the phase modulated by the phase modulator 33. The second element layer 201 may include an active optical element 11 that is provided on at least one of the plurality of passive optical elements, e.g., the optical waveguide 35, includes a semiconductor material, and generates light.

The first element layer 101 may have a structure in which an oxide layer OL2 and a silicon layer SL2 are sequentially stacked. The oxide layer OL2 may not include a plurality of trenches T spaced apart from one another. The first element layer 101 may include a plurality of passive optical elements formed by patterning the silicon layer SL2. The plurality of passive optical elements may be formed on the oxide layer OL2. The plurality of passive optical elements may include the phase modulator 33, the antenna 34, and the optical waveguide 35. Connection relationships among the phase modulator 33, the antenna 34, and the optical waveguide 35 will be described below with reference to FIG. 6.

Figure 4:
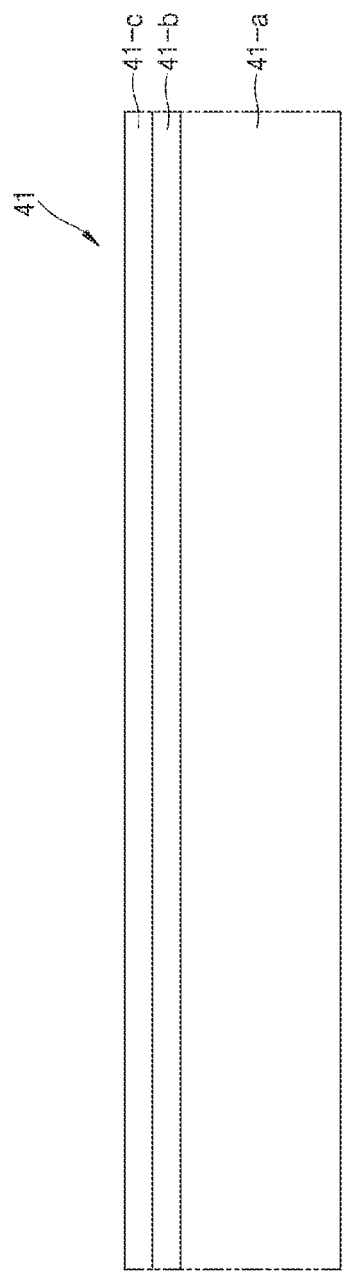
FIG. 4 is a schematic lateral cross-sectional view of a substrate used to form a first element layer included in the optical element array of FIG. 3.

FIG. 4 is a schematic lateral cross-sectional view of a substrate 41 used to form the first element layer 101 included in the optical element array 1001 of FIG. 3.

The substrate 41 may include a silicon-on-insulator (SOI) substrate on which an oxide layer 41-b and a silicon layer 41-c are sequentially stacked on a silicon substrate 41-a. The first element layer 101 may be formed by patterning the silicon layer 41-c.

Figure 5:
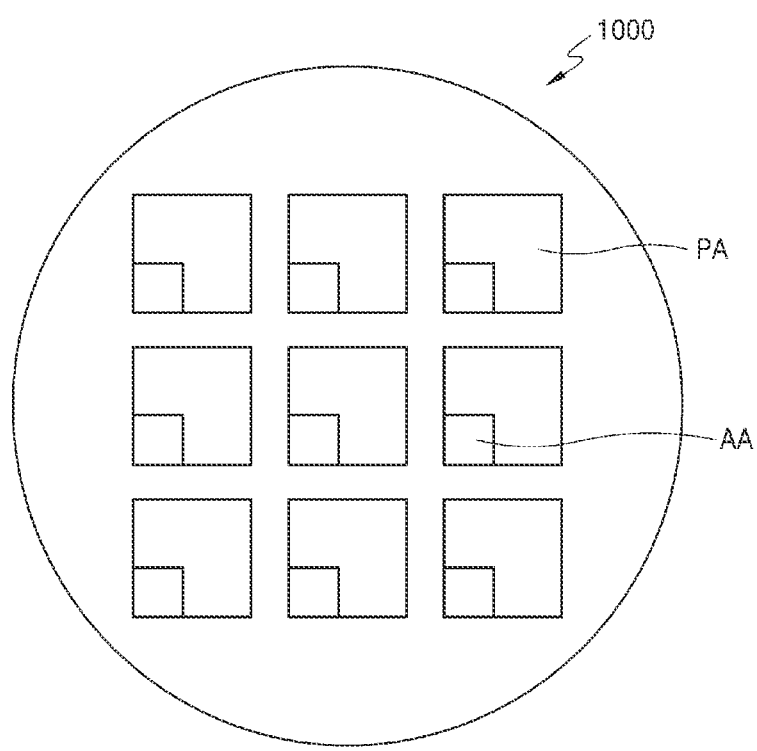
FIG. 5 is a schematic plan view of the optical element array of FIG. 1.

FIG. 5 is a schematic plan view of the optical element array 1000 of FIG. 1. Also, a plan view of the optical element array 1001 may be the same as that of FIG. 5.

Referring to FIG. 5, the optical element array 1000 may include a passive area PA and an active area AA formed in a portion of the passive area PA. In FIG. 5, nine passive areas PA are shown, but embodiments are not limited thereto. There may be a large number of passive areas PA. The plurality of passive optical elements of FIG. 1 may be provided in the passive areas PA. The active optical element 10 of FIG. 1 may be provided in the active area AA. The plurality of passive areas PA may be provided to be a constant distance apart from one another.

Figure 6:
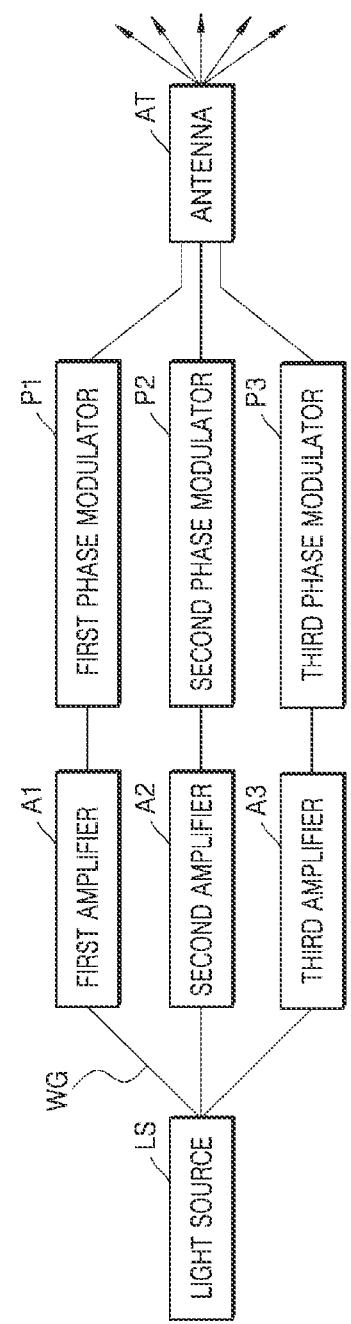
FIG. 6 is a schematic view of a connection structure of optical elements included in the optical element arrays according to example embodiments shown in FIGS. 1 and 3.

FIG. 6 is a schematic view of a connection structure of optical elements included in the optical element arrays 1000 and 1001 according to example embodiments shown in FIGS. 1 and 3. The connection structure may further include a plurality of amplifiers, e.g., a first amplifier A1, a second amplifier A2, and a third amplifier A3.

Referring to FIG. 6, the optical element array 1000 of FIG. 1 or the optical element array 1001 of FIG. 3 may include a light source LS for emitting light, a first amplifier A1 for amplifying light transmitted by a waveguide WG from the light source LS, a first phase modulator P1, a second phase modulator P2, and a third phase modulator P3 for modulating the phase of light transmitted by the waveguide WG from the first amplifier A3, the second amplifier A2, and the third amplifier A3, and an antenna AT that emits light transmitted by the waveguide WG from the first phase modulator P1, the second phase modulator P2, and the third phase modulator P3 to the outside of the optical element array 1000 or the optical element array 1001. The optical element array 1000 or the optical element array 1001 may be an optical phase array OPA that adjusts the traveling direction of light.

The light source LS may be the active optical element 10 of FIG. 1 or the active optical element 11 of FIG. 3. For example, the light source LS may include a LD and a TLD.

The first amplifier A1, the second amplifier A2, and the third amplifier A3 may amplify a signal of light emitted from the light source LS. For example, the first amplifier A1, the second amplifier A2, and the third amplifier A3 may increase the amplitude of light.

The first phase modulator P1, the second phase modulator P2, and the third phase modulator P3 may modulate the phase of light amplified by the first amplifier A1, the second amplifier A2, and the third amplifier A3. Degrees to which the phase of light is modulated by the first phase modulator P1, the second phase modulator P2, and the third phase modulator P3 may differ.

Also, the traveling direction of light may be changed by an interference phenomenon of light generated by the antenna AT. An interference pattern of light formed at the antenna AT may be adjusted by changing the phase modulation amount of the light by adjusting the magnitudes of voltages respectively applied to the first phase modulator P1, the second phase modulator P2, and the third phase modulator P3. Accordingly, by controlling the interference pattern of light at the antenna AT, the traveling direction of the light may be adjusted.

Figure 7:
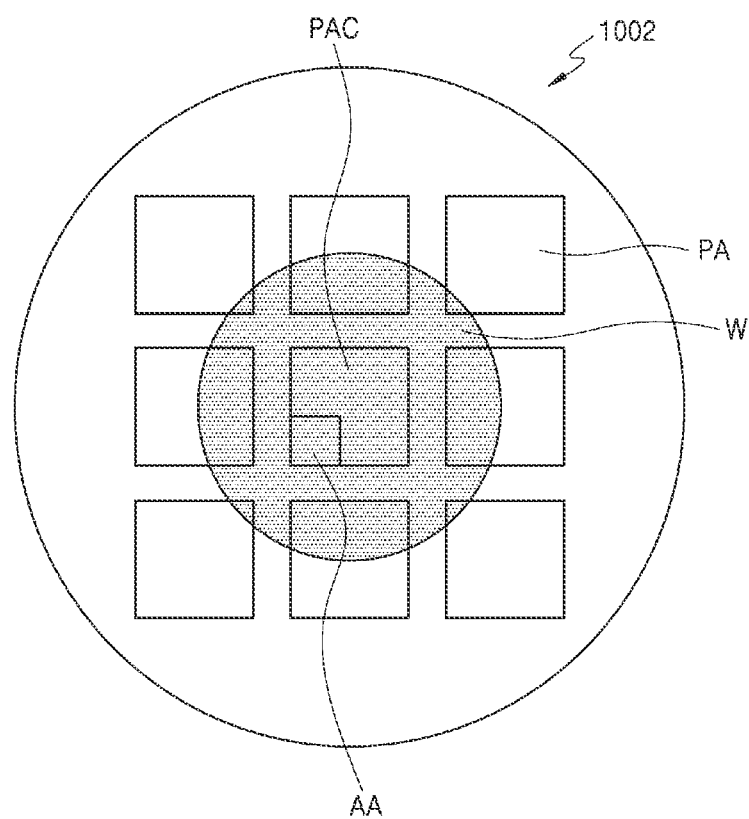
FIG. 7 is a schematic plan view of an optical element array according to a related example.

FIG. 7 is a schematic plan view of an optical element array 1002 according to a related example.

Referring to FIG. 7, the optical element array 1002 may include passive areas PA and an active area AA formed in a portion of the passive areas PA. In FIG. 7, nine passive areas PA are shown, but embodiments are not limited thereto. There may be a large number of passive areas PA. A plurality of passive optical elements may be provided in the passive areas PA. Meanwhile, an active optical element may be provided in the active area AA.

The active optical element may be formed by attaching a compound semiconductor wafer W onto the passive areas PA and patterning the same. Here, in the case of using one compound semiconductor wafer W, the active area AA may be formed only in some of a plurality of passive areas PA, e.g., a passive area PAC located at the center of a substrate. A plurality of compound semiconductor wafers W may be needed to form active areas AA in all of the passive areas PA. In this case, the remaining portions of the compound semiconductor wafers W after forming the active areas AA that do not include the active areas AA may be wasted.

FIGS. 8 to 15 are diagrams sequentially showing a method of forming the first element layer 100 of an optical element array of FIG. 1 according to an example embodiment.

Figure 8:
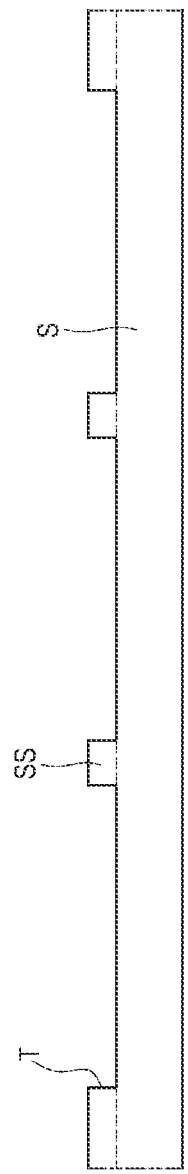
FIGS. 8 to 15 are diagrams sequentially showing a method of forming a first element layer of an optical element array according to an example embodiment.

Referring to FIG. 8, the plurality of trenches T may be formed in the silicon substrate S. The plurality of trenches T may be spaced apart from one another by a silicon barrier SS.

Figure 9:
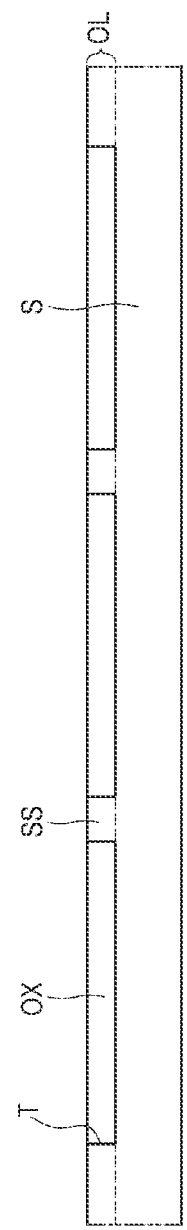

Referring to FIG. 9, the plurality of trenches T may be filled with the oxide OX. For example, the oxide OX may be silicon oxide ($SiO_2$). Furthermore, the plurality of trenches T including the oxide OX may be planarized through a chemical-mechanical polishing (CMP) process to form an oxide layer OL.

Figure 10:
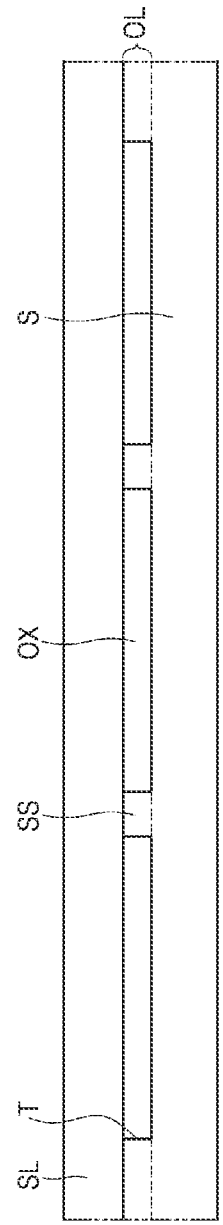

Referring to FIG. 10, a silicon layer SL may be deposited on the oxide layer OL. By depositing the silicon layer SL on the oxide layer OL, a structure in which the oxide OX is surrounded by silicon may be formed. According to an example embodiment, the oxide layer OL may not include the silicon barrier SS and be entirely made of an oxide, and thus an SOI substrate, e.g., the substrate 41 of FIG. 4, having a structure in which the silicon layer SL, an oxide layer OL without the trenches T, and a silicon film SF are sequentially stacked, may be formed.

Figure 11:
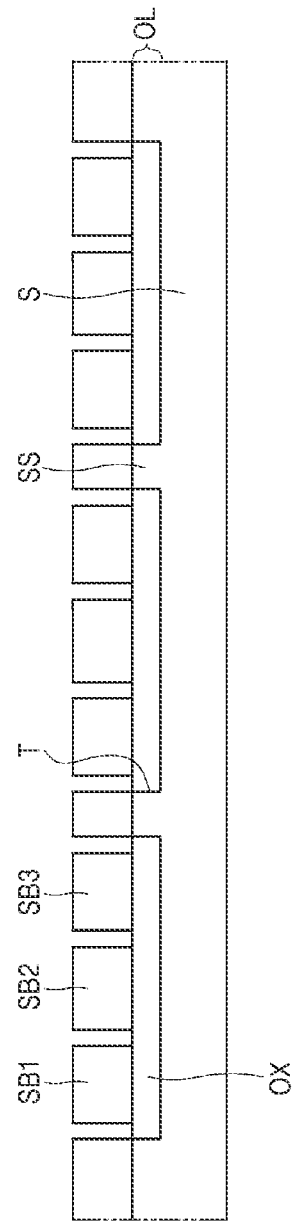

Referring to FIG. 11, a plurality of silicon blocks, e.g., a first silicon block SB1, a second silicon block SB2, and a third silicon block SB3, may be formed on the oxide OX by patterning the silicon layer SL.

Figure 12:
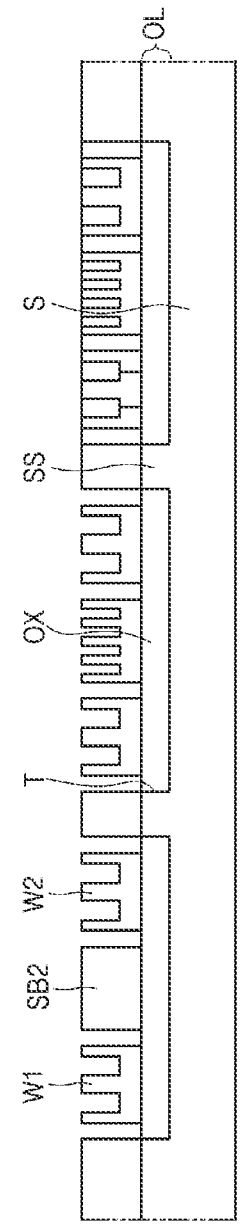

Referring to FIG. 12, a plurality of waveguides, e.g., a first waveguide W1 and a second waveguide W2, may be formed by patterning the first silicon block SB1, and the third silicon block SB3.

Figure 13:
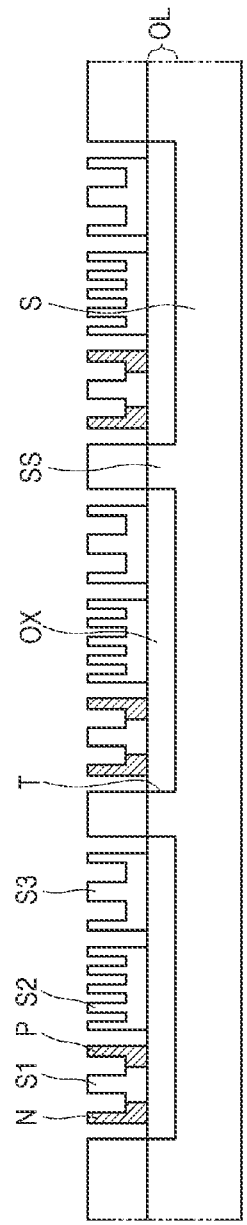

Referring to FIG. 13, a phase modulator S1 may be formed by doping the first waveguide W1 with an impurity. For example, an region N of the first waveguide W1 may be doped with arsenic (As), a region P of the first waveguide W1 may be doped with boron (B). Also, an antenna S2 may be formed by patterning the second silicon block SB2. The second waveguide W2 of FIG. 12 may correspond to a waveguide S3 that becomes the traveling path of light.

Figure 14:
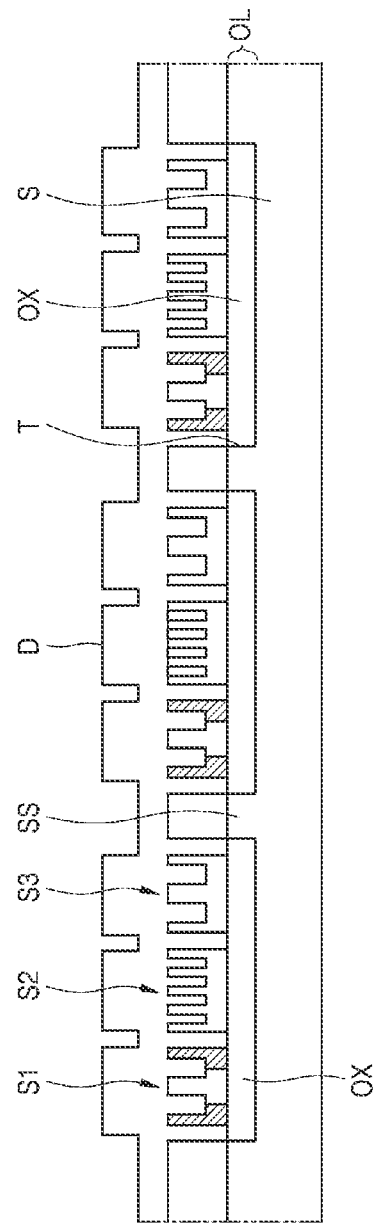

Referring to FIG. 14, a dielectric layer D may be formed on the phase modulator S1, the antenna S2, and the waveguide S3. The dielectric layer D may include the same material as the oxide OX. For example, the dielectric layer D may include $SiO_2$.

Figure 15:
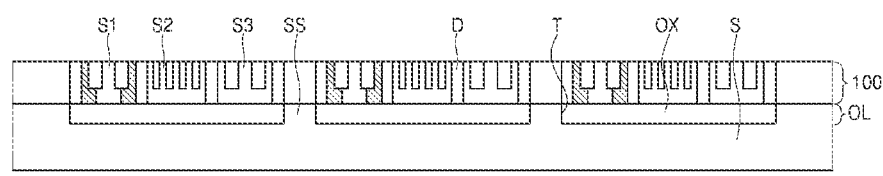

Referring to FIG. 15, the dielectric layer D may be planarized through a CMP process. The first element layer 100 including the dielectric layer D planarized through a CMP process, the phase modulator S1, the antenna S2, and the waveguide S3 may be formed.

Accordingly, the first element layer 100 including a plurality of passive optical elements may be formed. The plurality of passive optical elements may include, for example, the phase modulator S1, the antenna S2, and the waveguide S3. The waveguide S3 may be configured to transmit light generated by the active optical element 10 of FIG. 1 or the active optical element 11 of FIG. 3 to the antenna S2 and the phase modulator S1. The antenna S2 may be configured to emit light with the phase changed by the phase modulator S1 to the outside. The phase modulator S1 may be configured to modulate the phase of light generated by the active optical element 10 or the active optical element 11. For example, when a voltage is externally applied between the region P and the region N of the phase modulator S1, a change occurs in the carrier concentration in the phase modulator S1, and thus the phase of light passing through the phase modulator S1 may be modulated.

Figure 16:
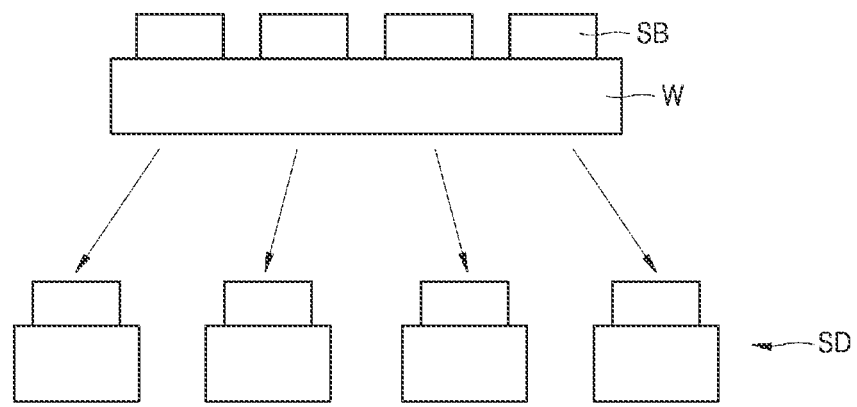
FIG. 16 is a schematic diagram showing a method of forming a semiconductor die in a method of fabricating an optical element array according to an example embodiment.

FIG. 16 is a schematic diagram showing a method of forming a semiconductor die SD in the method of fabricating an optical element array according to an example embodiment.

Referring to FIG. 16, a plurality of semiconductor blocks SB may be formed on the compound semiconductor wafer W. The compound semiconductor wafer W and the semiconductor blocks SB may include a Group III-V semiconductor material. Furthermore, the plurality of semiconductor dies SD may be formed by dicing the compound semiconductor wafer W by the semiconductor blocks SB. The Group III-V semiconductor material may include InP or InGaAsP.

FIGS. 17 to 25 are diagrams sequentially showing a method of forming the second element layer 200 of an optical element array of FIG. 1 according to an example embodiment. The second element layer 200 may be formed by using a first element layer formed by using the method of fabricating an optical element array shown in FIGS. 8 to 15 and the semiconductor die SD shown in FIG. 16.

Figure 17:
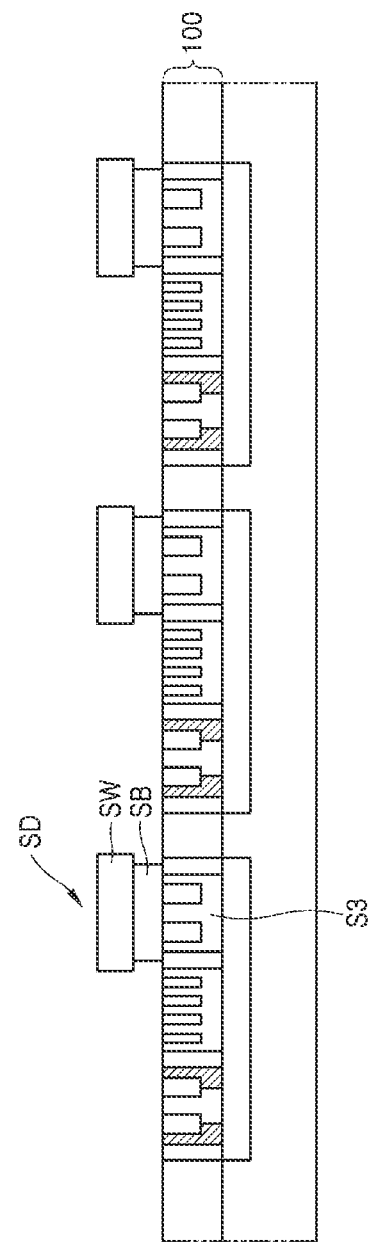
FIGS. 17 to 25 are diagrams sequentially showing a method of forming a second element layer of an optical element array according to an example embodiment.

Referring to FIG. 17, the semiconductor die SD may be attached onto the waveguide S3. For example, the semiconductor die SD may be bonded in correspondence to the waveguide S3.

Figure 18:
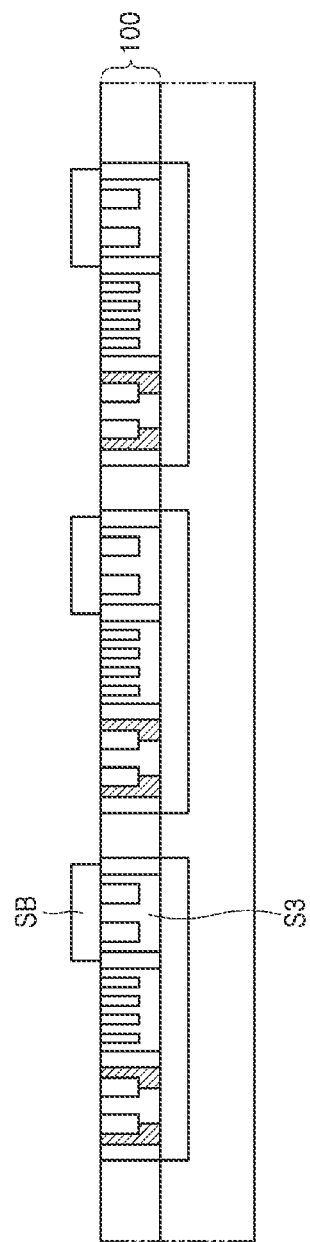

Referring to FIG. 18, the compound semiconductor wafer SW of the semiconductor die SD may be removed.

Figure 19:
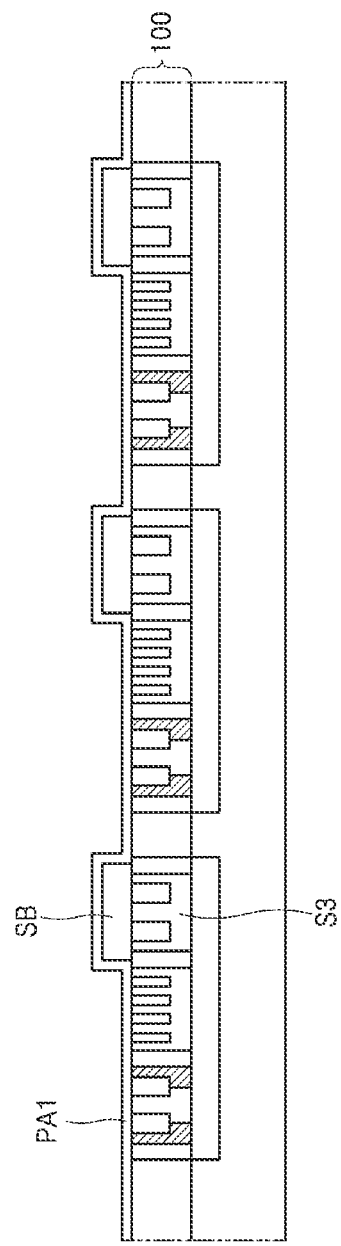

Referring to FIG. 19, a first passivation layer PA1 may be deposited to cover the first element layer 100 and the semiconductor block SB. The first passivation layer PA1 may later function as a CMP stop layer during a substrate planarization through a CMP process. For example, when CMP process equipment touches the first passivation layer PA1, a CMP process may stop. Also, the first passivation layer PA1 may include nitrogen or a metal that is not removed by the CMP process. The metal may include, for example, at least one of aluminum (Al), titanium (Ti), and copper (Cu). The first passivation layer PA1 may be configured to serve as the CMP stop layer, thereby preventing the semiconductor block SB from being damaged by a CMP process.

Figure 20:
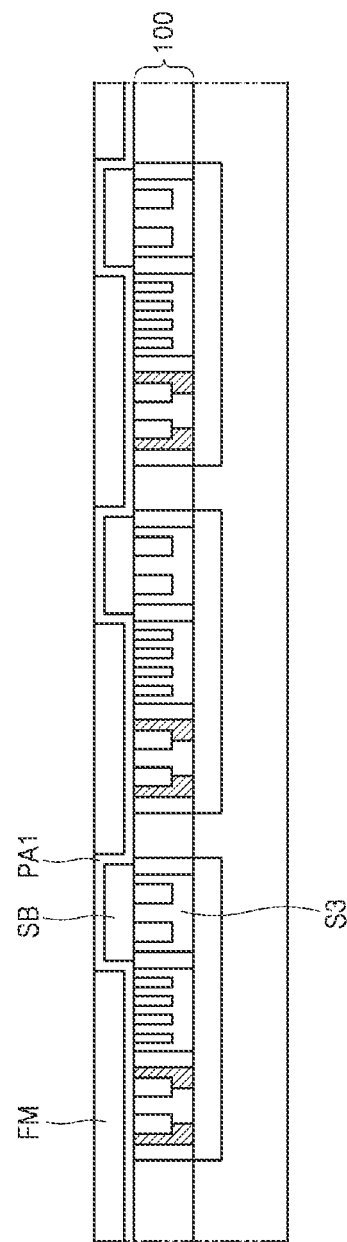

Referring to FIG. 20, a planarization material FM may be deposited on the first passivation layer PA1 and the planarization material FM may be planarized through a CMP process. The planarizing material FM may include, for example, any one of an oxide and a polymer. As described above, since a CMP process may be stopped when CMP process equipment touches the first passivation layer PA1, the semiconductor block SB provided under the first passivation layer PA1 may be prevented from being damaged by the CMP process.

Figure 21:
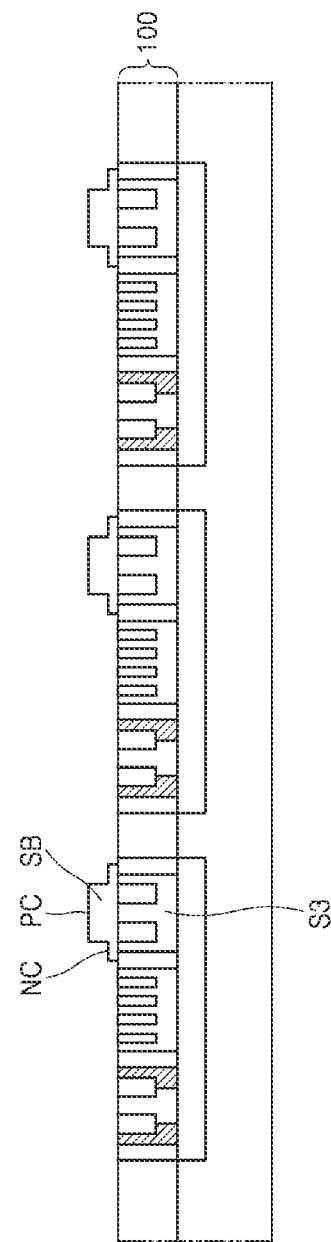

Referring to FIG. 21, a layer including the planarizing material FM, the semiconductor block SB, and the first passivation layer PA1 of FIG. 20 may be patterned to form a P-type connecting portion PC and an N-type connecting portion NC.

Figure 22:
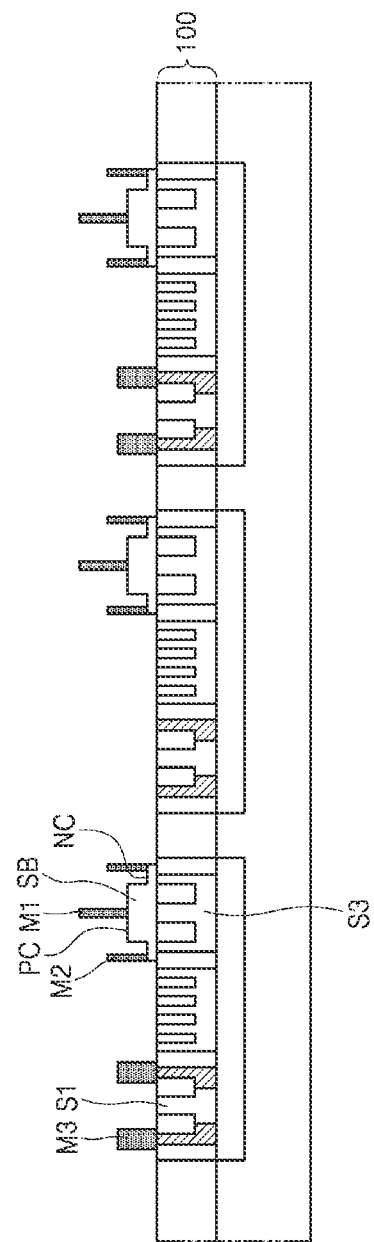

Referring to FIG. 22, a first electrode M1 may be formed at the P-type connecting portion PC of the semiconductor block SB, a second electrode M2 may be formed at the N-type connecting portion NC, and a third electrode M3 may be formed on the phase modulator S1. The first electrode M1 may include any one of platinum (Pt_), Ti, and Au, but embodiments not limited thereto, and the first electrode M1 may include other metals. Although the second electrode M2 may include any one of Ni, Ge, and Au, embodiments are not limited thereto, and the second electrode M2 may include other metals. The third electrode M3 may include any one of Ni, Ge, and Au, embodiments are not limited thereto, and the third electrode M3 may include other metals.

Figure 23:
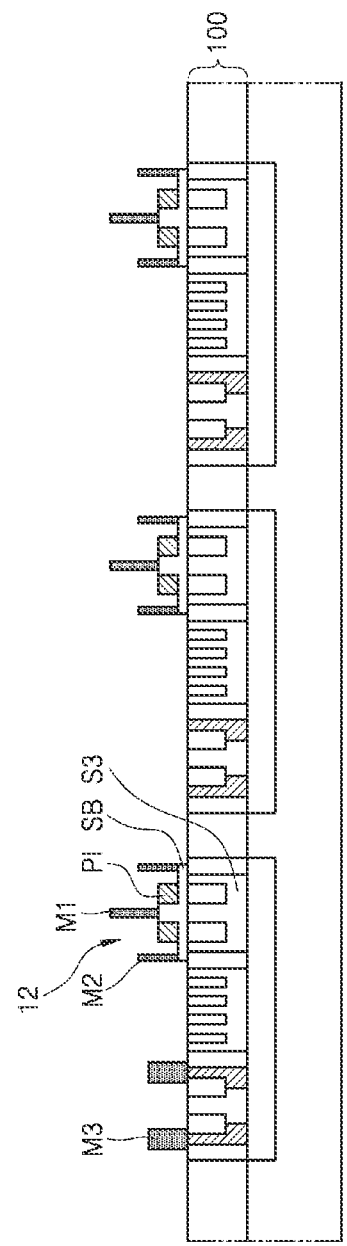

Referring to FIG. 23, a proton implant layer PI may be formed by implanting protons to the semiconductor block SB. An element in which the semiconductor block SB includes the proton implant layer PI may be an active optical element 12, e.g., a light source. For example, the light source may include any one of a LD and a TLD. The proton implant layer PI may be configured to constrain charges. For example, a current flowing by a voltage applied between the first electrode M1 and the second electrode M2 may be constrained between the proton implant layers PI. As the current is constrained between the proton implant layers PI, light generation efficiency of the active light element 12 may be increased.

Figure 24:
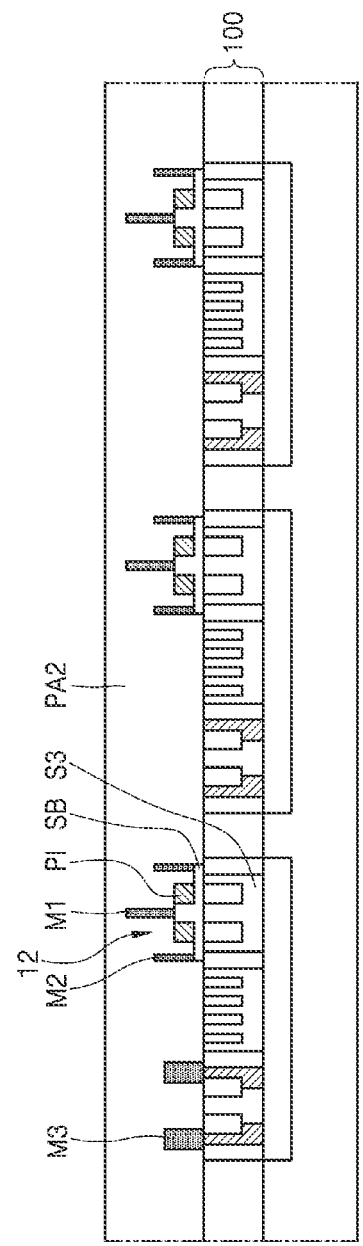
Figure 25:
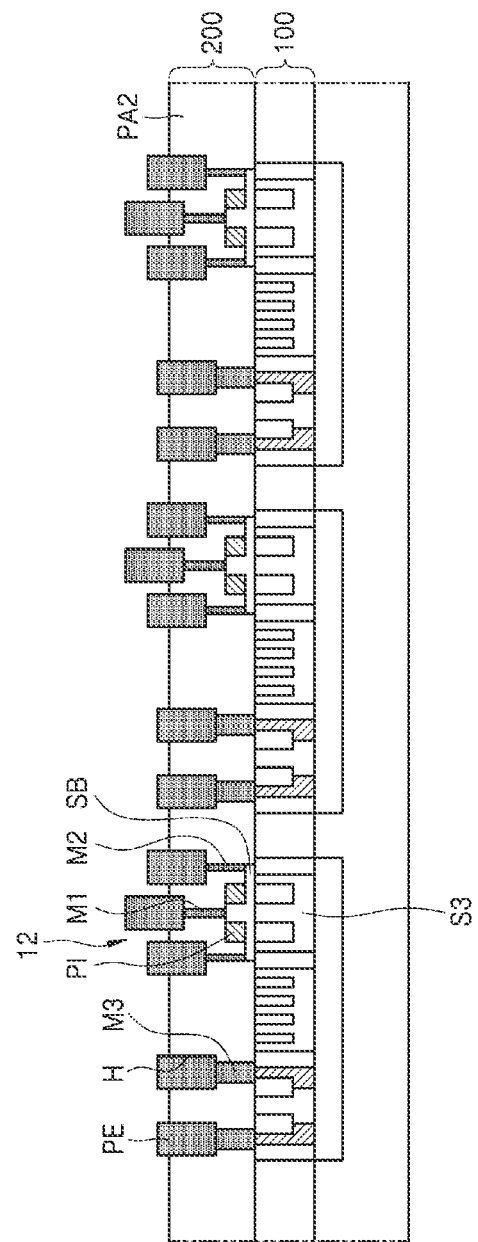

Referring to FIG. 24, a second passivation layer PA2 covering the active optical element 12 and the third electrode M3 may be formed Referring to FIG. 25, a plurality of holes H may be formed in the second passivation layer PA2, and a plurality of pad electrodes PE may be respectively formed in the plurality of holes H. The plurality of pad electrodes PE may be connected to the first electrode M1, the second electrode M2, and the third electrode M3, respectively.

Accordingly, the second element layer 200 including a plurality of active optical elements 12 may be formed on the first element layer 100.

Figure 26:
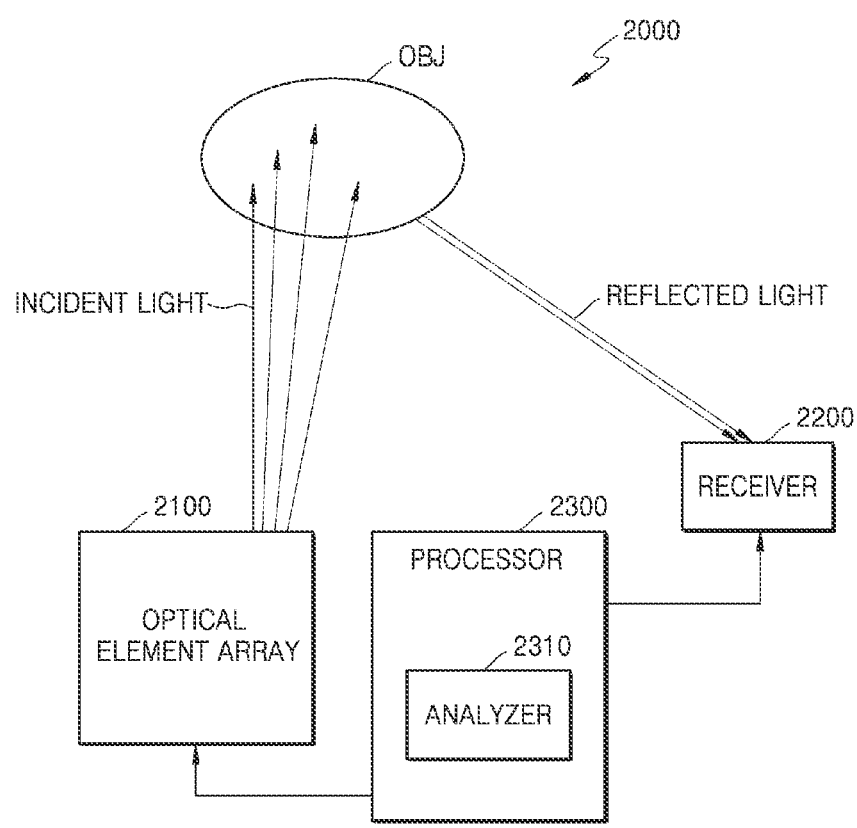
FIG. 26 is a schematic view of an optical system according to an example embodiment.

FIG. 26 is a schematic view of an optical system 2000 according to an example embodiment.

Referring to FIG. 26, the optical system 2000 may include an optical element array 2100 for generating light and directing the light toward an object OBJ by adjusting the traveling direction of the light, a receiver 2200 for receiving light reflected by the object OBJ, and a processor 2300 for controlling the receiver 2200 and the optical element array 2100.

The optical element array 2100 may include the optical element array 1000 of FIG. 1 or the optical element array 1001 of FIG. 3.

The processor 2300 may control the overall operation of the optical system 2000. The processor 2300 may include an analyzer 2310 for analyzing the positional distribution and/or the time distribution of light received by the receiver 2300 and separately processing light irradiated onto the object OBJ in a plurality of directions.

The optical system 2000 including the optical element array 2100 according to example embodiments may be a light detection and ranging (LiDAR). The LiDAR may detect a distance, a direction, a speed, a temperature, a material distribution, and concentration characteristics regarding an object by irradiating a laser beam to the object. The LiDAR may be used in a laser scanner for an autonomous driving vehicle and a 3D video camera. The LiDAR may be applied to an automotive LiDAR, a LiDAR for a robot, a LiDAR for a drone, etc.

In addition, the optical element array 2100 according to example embodiments may be applied to an intruder detecting security system, a hybrid laser diode, a semiconductor optical amplifier, a subway screen door obstacle detection system, a 3D sensor, a depth sensor, a user face recognition sensor in a mobile phone, an augmented reality (AR), motion recognition and object profiling in a TV or an entertainment device.

According to an example embodiment, the waste of compound semiconductor wafers during fabrication of optical element arrays may be reduced. Also, damage to active optical elements may be reduced or prevented during fabrication of optical element arrays.

According to an example embodiment, an optical element array with reduced waste of a compound semiconductor wafer and an optical system including the same may be provided.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. An optical element array comprising:
   a silicon substrate;
   a first element layer provided on the silicon substrate, the first element layer comprising a waveguide configured to transmit light, a phase modulator configured to adjust a phase of the light, and an antenna configured to adjust a traveling direction of light with the phase modulated by the phase modulator; and
   a second element layer provided on the waveguide, the second element layer comprising an active optical element that is configured to generate light and comprises a semiconductor material, wherein the active optical element comprises proton implant layers spaced apart from one another.

2. The optical element array of claim 1, wherein the semiconductor material comprises a Group III-V semiconductor material.

3. The optical element array of claim 1, wherein the active optical element is formed by sequentially depositing a first passivation layer and a planarizing material on the semiconductor material and planarizing the same through chemical-mechanical polishing.

4. The optical element array of claim 3, wherein the first passivation layer comprises any one of nitrogen and a metal.

5. The optical element array of claim 3, wherein the planarizing material comprises at least one of an oxide and a polymer.

6. The optical element array of claim 1, wherein the proton implant layers are configured to constrain charges.

7. An optical element array comprising:
   a silicon substrate;
   a first element layer provided on the silicon substrate, the first element layer comprising a waveguide configured to transmit light, a phase modulator configured to adjust a phase of the light, and an antenna configured to adjust a traveling direction of light with the phase modulated by the phase modulator; and
   a second element layer provided on the waveguide, the second element layer comprising an active optical element that is configured to generate light and comprises a semiconductor material, wherein the first element layer comprises a plurality of trenches provided in the substrate and spaced apart from one another, and the phase modulator, the antenna, and the waveguide are provided in the trenches.

8. The optical element array of claim 7, wherein the trenches are filled with oxide.

9. An optical system comprising:
an optical element array configured to generate light and direct the traveling direction of the light towards an object, the optical element array comprising:
a silicon substrate;
a first element layer provided on the silicon substrate, the first element layer comprising a waveguide configured to transmit light, a phase modulator configured to adjust a phase of the light, and an antenna configured to adjust a traveling direction of light with the phase modulated by the phase modulator; and
a second element layer provided on the waveguide, the second element layer comprising an active optical element that is configured to generate light and comprises a semiconductor material, wherein the active optical element comprises proton implant layers spaced apart from one another;
a receiver configured to receive light from the object; and
a processor configured to control the receiver and the optical element array.

10. The optical system of claim 9, wherein the processor comprises an analyzer configured to analyze light received by the receiver.

* * * * *